US007128820B2

(12) United States Patent
Lee

(10) Patent No.: US 7,128,820 B2
(45) Date of Patent: Oct. 31, 2006

(54) PROCESS FOR PREPARING A NON-CONDUCTIVE SUBSTRATE FOR ELECTROPLATING

(76) Inventor: Hyunjung Lee, 274 Spring St. - Apt. #8, Naugatuck, CT (US) 06770

( * ) Notice: Subject to any disclaimer, the term of this patent is extended or adjusted under 35 U.S.C. 154(b) by 321 days.

(21) Appl. No.: 10/798,522

(22) Filed: Mar. 11, 2004

(65) Prior Publication Data

US 2005/0199504 A1  Sep. 15, 2005

(51) Int. Cl.
C25D 5/54 (2006.01)
C25D 5/56 (2006.01)
C25D 5/38 (2006.01)
H05K 3/00 (2006.01)
C25B 1/26 (2006.01)

(52) U.S. Cl. ............... 205/159; 205/162; 205/163; 205/164; 205/166; 205/210; 205/125; 252/500; 252/502

(58) Field of Classification Search ........... 252/500, 252/502; 205/159, 162, 163, 164, 166, 210, 205/125
See application file for complete search history.

(56) References Cited

U.S. PATENT DOCUMENTS

| | | | |
|---|---|---|---|
| 4,619,741 A * | 10/1986 | Minten et al. ............... 205/125 |
| 4,622,107 A | 11/1986 | Piano | |
| 4,622,108 A | 11/1986 | Polakovic et al. | |
| 4,631,117 A | 12/1986 | Minten et al. | |
| 4,634,691 A | 1/1987 | Hedglin et al. | |
| 4,684,560 A | 8/1987 | Minten et al. | |
| 4,718,993 A | 1/1988 | Cupta et al. | |
| 4,724,005 A | 2/1988 | Minten et al. | |
| 4,874,477 A | 10/1989 | Pendleton | |
| 4,897,164 A | 1/1990 | Piano et al. | |
| 4,964,959 A | 10/1990 | Nelsen et al. | |
| 4,994,153 A | 2/1991 | Piano et al. | |
| 5,015,339 A | 5/1991 | Pendleton | |
| 5,106,537 A | 4/1992 | Nelsen et al. | |
| 5,110,355 A | 5/1992 | Pendleton | |
| 5,139,642 A | 8/1992 | Randolph et al. | |
| 5,143,592 A | 9/1992 | Toro | |
| 5,476,580 A | 12/1995 | Thorn et al. | |
| 5,725,807 A | 3/1998 | Thorn et al. | |
| 5,759,378 A | 6/1998 | Ferrier et al. | |
| 6,235,182 B1 * | 5/2001 | Bele et al. .................. 205/159 |
| 6,440,331 B1 * | 8/2002 | Carano et al. .............. 252/506 |

OTHER PUBLICATIONS

Standard Test Method For Carbon Black-Oil Absorption Number (OAN)[1], ASTM International, Designation: D2414-04, no date.
Electrical Conductivity of Conductive Carbon Blacks: Influence Of Surface Chemistry and Topology, Dana Pantea, et al., Elsevier Science, Applied Surface Science 217 (2003) pp. 181-193, no month.
Comparison of Nitrogen and Carbon Dioxide Adsorption on Carbon Blacks. A Possibility To Obtain Information on Micropores and Basic Sites On the Surface?, H. Darmstadt, et al., Chemical Engineering Department, Laval University, Quebec, Canada and Institut Pyrovac Inc., Sainte-Foy, Canada, no date.
A Review Of The Technology Development Of Direct Metallization, Chi-Chao Wan, Proc. Natl. Sci. Counc. ROC(A), vol. 23, No. 3, 1999, pp. 365-368, no month.
Effects Of Carbon Black Properties On Conductive Coatings, John K. Foster, Special Blacks Division, Cabot Corporation, Billerica, MA, no date.
Effect of Carbon Black Physical Form On Dispersion Rate, Mary F. Heithaus, et al., Special Blacks Division, Cabot Corporation, Billerica, MA, no date.
Dispersion Aids For Carbon Blacks In Aqueous Systems, Special Blacks Division, Cabot Corporation, Billerica, MA, no date.
The Fundamentals of Carbon Black, Cabot Corporation, Billerica, MA, no date.
Material Safety Data Sheet, Carbon Black, Conductex®, Columbian Chemicals Company, Marietta, GA, no date.
What Are Conductive Carbon Blacks? And How Might I Use Them In My Products?, Ampacet, A-Bulletin, www.AMPACET.com, no date.
Carbon Black For Plastics: Global Recommendation Guide, Cabot Corporation, Billerica, MA, no date.
VULCAN® XC72, Carbon Black, Cabot Corporation, Billerica, MA, no date.
Special Black-High Color Pigment Black—MONARCH® 1300, Cabot Corporation, Billerica, MA, no date.
Sartomer Application Bulletin, Dispersing Carbon Black Using SMA® Resins or SMA® Imide Resin, Atofina, Exton, PA, no date.
Electrical Conductivity of Thermal Carbon Blacks. Influence of Surface Chemistry, Dana Pantea, et al., www.gch.ulaval.ca, no date.
Electrical Conductivity of Thermal Carbon Black, Compounding With Thermal Carbon Black For Low Conductivity, Cancarb, May 1997.
Raven Blacks, Typical Properties of Industrial Carbon Blacks and Industrial Carbon Black Applications, Columbian Chemicals Company, Marietta, GA, no date.
Using Raven® Blacks In Plastics Applications, Columbian Chemicals Company, Marietta, GA, no date.

* cited by examiner

*Primary Examiner*—Edna Wong
(74) *Attorney, Agent, or Firm*—Carmody & Torrance LLP

(57) ABSTRACT

A composition and process for electroplating a conductive metal layer onto the surface of a non-conductive material is disclosed. The composition and process utilizes an obvious dispersion traditional carbon black particles and highly conductive carbon black particles. The mixture of carbon blacks provides optimum dispersion and electroplating properties.

17 Claims, No Drawings

PROCESS FOR PREPARING A NON-CONDUCTIVE SUBSTRATE FOR ELECTROPLATING

FIELD OF THE INVENTION

The present invention is directed to a process for preparing a non-conductive substrate for electroplating using a carbon black dispersion. The novel carbon black dispersion of the invention contains a mixture of conventional carbon black particles and highly conductive carbon black particles dispersed in an aqueous media.

BACKGROUND OF THE INVENTION

Printed wiring boards (also known as printed circuit boards) are generally laminated materials comprised of two or more plates or foils of copper, which are separated from each other by a layer of nonconducting material. Although copper is generally used as the electroplating metal in printed wiring boards, those skilled in the art will recognize that other metals such as nickel, gold, palladium, silver and the like can also be electroplated. The nonconducting layer or layers are preferably an organic material such as an epoxy resin impregnated with glass fibers, but may also comprise thermosetting resins, thermoplastic resins, and mixtures thereof, with or without reinforcing materials such as fiberglass and fillers.

In many printed wiring board designs, the electrical pathway or pattern requires a connection between the separated copper layers at certain points in the pattern. Through holes are formed in printed circuit boards in order to establish connection between the circuit layers at certain points in the board to produce the desired electrical pattern. This is usually accomplished by drilling holes at the desired locations through the copper layers and the non-conducting layers, and then connecting the separate circuit layers by metallizing the through holes (i.e., coating the inner surface of the drilled or punched through hole with a conductive metal). The hole diameters of PCBs generally range from about 0.15 mm to about 10.0 mm, more typically from about 0.3 mm to about 1.0 mm.

While electroplating is a desirable method of depositing copper and other conductive metals on a surface, electroplating cannot be used to coat a nonconductive surface, such as an untreated through hole. It has thus been necessary to treat the through hole with a conductive material to make it amenable to electroplating. One process for making the through hole bores electrically conductive, is to physically coat them with a conductive film. The coated through holes are conductive enough to electroplate, but typically are not conductive and sturdy enough to form the permanent electrical connection between the circuit layers at either end of the through hole. The coated through holes are then electroplated to provide a permanent connection. Electroplating lowers the resistance of the through hole bore to a negligible level, which will not consume an appreciable amount of power or alter circuit characteristics. One advantageous way of preparing the through hole walls for electroplating utilizes a liquid carbon dispersion. The steps of this process are discussed briefly below.

First, surfaces of the through holes are drilled and deburred. In the case of multilayer printed circuit boards, it may also be desirable to subject the boards to a desmear or etchback operation to clean the inner copper interfacing surfaces of the through holes. Such methods are well known to those skilled in the art.

Then, the printed wiring board is preferably subjected to a precleaning process in order to place the printed wiring board in condition for receiving the liquid carbon black dispersion. After the application of the cleaner, the PWB is rinsed in water to remove excess cleaner from the board and then contacted with a conditioner solution. The conditioner solution is used to ensure that substantially all of the hole wall glass/epoxy surfaces are properly prepared to accept a continuous layer of the subsequent carbon black particles. See for example U.S. Pat. No. 4,634,691, to Lindsey, the subject matter of which is herein incorporate by reference in its entirety, which describes a suitable conditioner solution.

The liquid carbon dispersion is next applied to or contacted with the conditioned PWB. This dispersion contains three critical ingredients, namely, carbon black, one or more surfactants capable of dispersing the carbon and a liquid dispersing medium such as water. The preferred methods of applying the dispersion to the PCB include immersion, spraying or other methods of applying chemicals that are typically used in the printed circuit board industry. A single working bath is generally sufficient for applying this carbon dispersion; however, more than one bath may be used for rework or other purposes.

The carbon covered board is then subjected to a step where substantially all (i.e., more than about 95% by weight) of the water in the applied dispersion is removed and a dried deposit containing carbon is left in the holes and on other exposed surfaces of the nonconducting layer. To insure complete coverage of the hole walls, the procedure of immersing the board in the liquid carbon dispersion and then drying may be repeated.

The carbon (black) covered board is next optionally subjected to an additional graphite treatment yielding the deposition of a graphite layer on top of the carbon layer. In this instance, the carbon (black)-coated PWB board is preferably first contacted with a conditioner solution, which is used to promote subsequent adsorption of the dispersed graphite particles on the carbon (black) layer. After the application of this optional conditioner solution, the PWB is subsequently rinsed with water to remove excess conditioner from the board. The board may then be contacted with the liquid graphite dispersion or suspension. The board is then subjected to a step where substantially all (i.e., more than about 95% by weight) of the water in the applied dispersion is removed and a dried graphite deposit is left in the holes over the carbon (black) deposit and on other exposed surfaces of the nonconducting layer.

The steps of this process are described in more detail, for example, in U.S. Pat. No. 4,619,741, the subject matter of which is herein incorporated by reference in its entirety. Various modifications and refinements to this process are set forth in U.S. Pat. Nos. 4,622,107, 4,622,108, 4,631,117, 4,684,560, 4,718,993, 4,724,005, 4,874,477, 4,897,164, 4,964,959, 4,994,153, 5,015,339, 5,106,537, 5,110,355, 5,139,642, and 5,143,592, the subject matter of each of which is herein incorporated by reference in its entirety.

A continuing challenge in the art of carbon-based direct metallization is increasing the conductivity of the carbon coating that is deposited on the nonconductive surface to achieve faster electroplating, to allow electroplating over larger areas, and to provide other benefits.

Various methods have been suggested for increasing the conductivity of the carbon coating that is deposited. For example, U.S. Pat. No. 5,476,580 to Thorn et al., the subject matter of which is herein incorporated by reference in its entirety proposed to modify carbon (graphic) by adding surfactants or binders to the dispersion. U.S. Pat. No.

5,759,378 to Ferrier et al., the subject matter of which is herein incorporated by reference in its entirety, modifies the carbon black itself to reduce the resistivity of the carbon layer or improve the uniformity of the carbon layer on the non-conductive surface and/or the uniformity of the dispersion creating the carbon layer, increase the activity of the carbon surface toward plating, or combinations thereof.

Ferrier et al. describe various modifications to the carbon black, including treating the carbon with a dye prior to incorporating it in the dispersion composition, treating the carbon with various metals such that the metals are either absorbed onto the surface of the carbon or reduced into the surface of the carbon, and oxidation of the surface of the carbon, such as by chemical oxidation of the carbon, i.e., mixing the carbon with a solution of nitric acid for a time and at a temperature effective to appropriately oxidize the surface of the carbon. Ferrier et al. disclose that the carbon dispersion formed with the modified carbon is more uniform or the carbon forms a more uniform, more adherent, more active or less resistive coating on the non-conductive surface. These changes in the dispersion and/or the carbon coating, which resulted from the modification of the carbon itself, manifest themselves in improved coverage of the non-conductive surface with the plated metal, improved adhesion of the plated metal to the non-conductive surface, increased plating propagation rate, decreased resistance of the carbon coated non-conductive surface, or decreased plating time necessary to achieve complete coverage of the non-conductive surface with the plated metal.

However, there remains a need in the art for additional improvements in the conductivity of the carbon deposited on the non-conductive substrate.

SUMMARY OF THE INVENTION

The inventors herein have discovered an improved composition and process for electroplating conductive metal surfaces onto non-conductive surfaces. The composition and process utilize a mixture of traditional carbon blacks (ie. carbon blacks not meeting at least one of the criteria for highly conductive carbon blacks below) and highly conductive carbon blacks (ie. carbon blacks which have either (i) a surface area of at least about 150 $m^2/g$ or (ii) an oil absorption number of at least about 150 $cm^3/100$ g as an DBP (dibutyl phthalate) absorption value or (iii) less than 5% of volatiles). The mixture optimizes the dispersive properties of the composition and the electroplating properties of the process. Thus the following process is proposed:

A process for electroplating a conductive metal layer onto the surface of a non-conductive material comprising the steps of a. contacting said non-conductive surface with a liquid carbon black dispersion comprising:
(i) carbon black particles;
(ii) carbon black particles selected from the group consisting of
(i) carbon black particles having a surface area of at least 150 $m^2/g$, (ii) carbon black particles having an oil absorption number of at least about 150 $cm^3/100$ g as a DBP (dibutyl phthalate) absorption value, and (iii) carbon black particles having a % volatiles content of less than 5%;
(iii) one or more dispersing agents;
(iv) an alkali metal hydroxide; and
(v) water;
b. separating substantially all of the water from the conventional and highly conductive carbon black particles, such that the conventional and highly conductive carbon black particles are deposited on the non-conductive surface in a substantially continuous layer; and thereafter
c. electroplating a conductive metal layer Over the deposited carbon layer and said non-conductive surfaces.

DETAILED DESCRIPTION OF THE PREFERRED EMBODIMENTS OF THE INVENTION

The inventors have surprisingly discovered that replacing a portion of the conventional carbon black in a carbon suspension or dispersion with a highly conductive carbon black yields a layer of carbon that has improved conductivity and is more strongly adhered to a non-conductive substrate. The improved carbon dispersions of the invention are usable in processes for carbon-based direct metallization technology.

The inventors have found that using the carbon black dispersion of the invention, i.e., a mixture of conventional and highly conductive carbon blacks yields superior adhesion of the carbon dispersion to the non-conductive substrates, which can eliminate the need for a heat treating step after carbon coating. The elimination of the heat treatment step provides for an easier process, i.e., less processing steps, as well as better removal of carbon residues from copper foil surfaces.

A series of highly conductive carbon blacks have been developed and are commercially available. Examples of commercially available highly conductive carbon blacks include Conductex SC ultra and Conductex SC (available from Columbian Carbon Company), Vulcan XC 72R (available from Cabot Corporation), and Printex XE2 (available from Degussa-Huls AG).

The characteristics of these highly conductive carbon blacks include high structure, high porosity, non-oxidized surface and small module size as compared to conventional carbon blacks. Generally, highly conductive carbon blacks have a relatively high surface area of at least about 150 $m^2/g$, preferably greater than about 250 $m^2/g$. In addition, highly conductive carbon blacks have a relatively high oil absorption number as measured by ASTM D-2414. The carbon blacks useful in this invention as highly conductive carbon blacks preferably have oil absorption numbers of at least about 115 $cm^3/100$ g and preferably greater than 150 $cm^3/100$ g as an oil absorption number. The other characteristics of highly conductive carbon blacks is chemically clean particle surface with little oxidized species. The carbon blacks useful in this invention as highly conductive carbon blacks also include those carbon blacks having less than 5% of volatiles preferably less 3% of volatiles content.

Because highly conductive carbon blacks have fewer oxidized species on the surface of the carbon particles, they are difficult to disperse in aqueous media and require more dispersing agent. However, the addition of excessive dispersing agent decreases the conductivity of carbon blacks by increasing inter-particle resistance. The inventors have surprisingly found that blending conventional carbon black and highly conductive carbon black together in a carbon dispersion is desirable due to the difficulty of dispersing highly conductive carbon black in aqueous media.

A portion of the carbon black in the dispersion is replaced with a commercially available highly conductive carbon black. The ratio of highly conductive carbon black to conventional carbon black is generally in the range of about 1:10 to 10:1 by weight, preferably between about 1:5 to 1:1, by weight.

A preferred embodiment of the present invention relates to the preparation of a PCB through hole for the deposition of an electroplated layer of copper or other conductive metal (such as nickel, gold, silver, etc.) so as to form a connection between conductive metal layers which are sandwiched with non-conductive layers. Although this description is set out in terms of electroplating (or metallizing) the through holes of printed circuit boards, it will be understood that such is for ease of description only, and that the disclosed process is equally applicable to the preparation of various non-conductive surfaces for deposition of an electroplating metal layer on plastics applications.

In preparing the liquid carbon dispersion, the three primary ingredients, and any other preferred ingredients, are mixed together to form a stable dispersion. This may be accomplished by subjecting a concentrated form of the dispersion to ball milling, colloidal milling, high-shear milling, ultrasonic techniques or other like procedures to thoroughly mix the ingredients. The dispersion can then be later diluted with more water to the desired concentration for the working bath. The preferred method of mixing is ball milling a concentrated form of the dispersion in a container having glass mineral or plastic beads therein for at least about 1 hour. The mixing can continue for up to about 24 hours. This thorough mixing allows for the carbon particles to be intimately coated or wetted with the surfactant. The mixed concentrate is then mixed with water or some other liquid dispersing medium to the desired concentration. The working bath is preferably kept agitated during both the diluting and applying steps to aid in maintaining dispersion stability.

U.S. Pat. No. 5,476,580 to Thorn et al., the subject matter of which is herein incorporated by reference in its entirety proposed to modify carbon (graphite) by means of additions of surfactants or binders to the dispersion. U.S. Pat. No. 5,759,378 to Ferrie et al., the subject matter of which is herein incorporated by reference in its entirety, took the concept a step further and proposed to modify the carbon black itself to reduce the resistivity of the carbon layer or improve the uniformity of the carbon layer on the non-conductive surface and/or the uniformity of the dispersion creating the carbon layer, increase the activity of the carbon surface toward plating, or combinations thereof.

In addition to water and carbon, a surfactant capable of dispersing the carbon in the liquid dispersing medium is employed in the dispersion. One or more surfactants are added to the dispersion to enhance the wetting ability and stability of the carbon and to permit maximum penetration by the carbon within the pores and fibers of the non-conducting layer of the PCB.

Suitable surfactants include anionic, nonionic and cationic surfactants (or combinations thereof such as amphoteric surfactants). The surfactant should be soluble, stable and preferably non-foaming in the liquid carbon dispersion. In general, for a polar continuous phase as in water, the surfactant should preferably have a high HLB number (8–18).

The preferred type of surfactant will depend mainly on the pH of the dispersion. If the total dispersion is alkaline (i.e. has an overall pH in the basic range), it is preferred to employ an anionic or nonionic surfactant. Acceptable anionic surfactants include sodium or potassium salts of naphthalene sulfonic acid. Preferred anionic surfactants include neutralized phosphate ester-type surfactants. Suitable nonionic surfactants include ethoxylated nonyl phenols or alkoxylated linear alcohols. Specific examples of suitable surfactants are listed, for example, in U.S. Pat. Nos. 4,622, 108, 4,724,005, 4,879,164, 5,015,339 and 5,139,642, the subject matter of which is herein incorporated by reference in its entirety. Other suitable surfactants would also be known to one skilled in the art.

Advantageously, carbon is present in the dispersion in an amount of less than about 15% by weight of the dispersion, preferably less than about 5% by weight, most preferably less than 2% by weight when the form of carbon is carbon black it has been found that the use of higher concentrations of carbon blacks may provide undesirable plating characteristics. In the same regard, the solids content (i.e. all of the ingredients other than the liquid dispersing medium) is preferably less than about 10% by weight of the dispersion, more preferably, less than about 6% by weight.

The liquid dispersion of carbon is typically placed in a vessel and the printed circuit board is immersed in, sprayed with or otherwise contacted with the liquid dispersion. The temperature of the liquid dispersion in an immersion bath should be maintained at between about 15° C. and about 35° C. and preferably between about 20° C. and about 30° C. during immersion. The period of immersion advantageously ranges from about 15 seconds to about 10 minutes, more preferably from about 30 seconds to 5 minutes.

The immersed board is then removed from the bath of the liquid carbon-containing dispersion and is preferably contacted with compressed air to unplug any through holes that may still retain plugs of the dispersion. In addition, excess basic liquid carbon-containing dispersion is removed from the face of the copper plates.

Next, substantially all (i.e. over about 90% by weight) of the water (or other liquid dispersing medium) in the applied dispersion is removed and a dried deposit containing carbon is left on the surfaces of the non-conducting material. This may be accomplished by several methods such as by evaporation at room temperature, by a vacuum, or by heating the board for a short time at an elevated temperature. Heating at an elevated temperature is the preferred method. Heating is generally carried out for between about 5 and about 45 minutes at a temperature of from about 75° C. to about 120° C., more preferably from about 80° C. to 98° C. To insure complete coverage the hole walls, the procedure of immersing the board in the liquid carbon dispersion and then drying may be repeated one or more times.

The resulting PCB is often completely coated with the carbon dispersion. The dispersion is not only coated on the drilled hole surfaces, as desired, but also coats the copper plate or foil surfaces, which is disadvantageous. Thus prior to any further processing, the carbon should be removed from the copper plate or foil surface.

The removal of the carbon may be preferably achieved by the employment of a mechanical scrubbing operation or a microetch. The microetch is preferred because of ease of use. In the case of a multilayer type board, this microetching step is especially preferred. Since, after the drying step, not only will the outer copper plate or foil be coated with carbon but also the copper inner plates or foils exposed within the holes.

The thusly treated printed wiring board is then immersed in a suitable electroplating bath for applying a copper coating on the hole walls of the non-conducting layer.

The present invention contemplates the use of any and all electroplating operations conventionally employed in applying a metal layer to the through hole walls of a PCB. Therefore this claimed invention should not be limited to any particular electroplating bath parameters.

A typical copper electroplating bath is comprised of copper, copper sulfate, $H_2SO_4$ and chloride ion in aqueous solution. The electroplating bath is normally agitated and preferably maintained at a temperature of between about 20° C. and about 25° C. The electroplating bath is provided with anodes, generally constructed of copper, and the printed circuit board to the plated is connected as a cathode to the electroplating circuit. A current is then impressed across the electroplating circuit for a period of between about 60 and about 90 minutes in order to effect copper plating on the hole walls of the non-conducting layer positioned between the two plates of copper. This copper plating of the hole wall provides a current path between the copper layers of the printed circuit board. Other suitable electroplating conditions may be employed, if desired. Other electroplating bath compositions containing other copper salts or other metal salts such as salts of nickel, gold, silver and the like may be employed, if desired.

The printed circuit board is removed from the copper electroplating bath and then washed and dried to provide a board which is further processed by applying photoresist compounds and the like, as is known in the art for the preparation of printed circuit boards.

The invention is further illustrated with reference to the following examples which should not be taken as limiting.

Propagation rate was measured using Hull cell chain panels. The panels are composed of two sets of 8 through holes, which are connected by copper foil on the alternating surface. Thus, a conductive path is established by through hole plating. The holes are examined after electroplating and the number of plated holes indicates propagation rate. A greater number of plated holes indicates faster propagation through holes.

A carbon dispersion consisting of 385 grams of deionized water, 60 grams of alkaline hydroxide solution, 17 grams of anionic dispersing agent, and 38 grams of carbon black was prepared by mixing for 3 minutes. This concentrated form of the dispersion was diluted with deionized water to achieve a solids content of 3 to 4%. pH was adjusted to 10–11 by bubbling carbon dioxide in the dispersion.

Table 1 provides the formulation for the five dispersions that were used in the Examples.

TABLE 2

| | Type of Carbon Black | | | |
|---|---|---|---|---|
| Dispersion | Conventional (Monarch 1300[1]) | Highly Conductive (Printex XE-2[2]) | Highly Conductive (Conductex SC Ultra[3]) | Highly Conductive (Vulcan XC72[1]) |
| 1 | 38 grams | | | |
| 2 | 26.6 grams | 11.4 grams | | |
| 3 | 26.6 grams | | 11.4 grams | |
| 4 | 26.6 grams | | | 11.4 grams |
| 5 | | 38 grams | | |

[1]Available from Cabot Corporation
[2]Available from Degussa-Huls AG
[3]Available from Columbian Carbon Company

EXAMPLE 1

Hull cell chain panels were processed through the following sequence for the indicated times:
1) Blackhole® conditioner SP (30 seconds)
2) Rinse, deionized water (30 seconds)
3) Carbon black dispersion (45 seconds)
4) Air/dry heat treatment at 40° C. (2 minutes)
5) Blackhole® microclean (45 seconds)
6) Rinse, deionized water (30 seconds)
7) Air dry
8) 10% $H_2SO_4$ (30 seconds)
9) Electroplating with Macuspec® 9280/85 copper solution in a Hull cell (5 minutes)
10) Rinse, deionized water (30 seconds)
11) Air dry After treatment with this sequence of baths, the holes in each panel were examined. The numbers of electroplated through holes are shown in Table 2.

TABLE 3

| Number of holes electroplated | |
|---|---|
| | Number of holes electroplated |
| Dispersion 1 | 7.5 |
| Dispersion 2 | 12.5 |
| Dispersion 3 | 12 |
| Dispersion 4 | 11 |

Example 1 demonstrates that the presence of highly conductive carbon blacks in the carbon dispersion improves propagation of the through holes in the printed circuit board.

EXAMPLE 2

Hull cell chain panels were processed through the same sequence of procedures as in Example 1 using dispersions 1, 2, and 5 for carbon coating. The numbers of electroplated holes are shown in Table 3.

TABLE 4

| Number of holes electroplated | |
|---|---|
| | Number of holes electroplated |
| Dispersion 1 | 6 |
| Dispersion 2 | 10 |
| Dispersion 5 | 4 |

Example 2 demonstrates that a blend of conventional carbon black and highly conductive carbon black is preferred to achieve faster propagation. When highly conductive carbon black is used solely as the carbon black in the dispersion (dispersion 5), propagation is slower than with conventional carbon coating due to the excess amount of dispersing agent that is needed to disperse the highly conductive carbon black. Since highly conductive carbon black has less oxidized species on the surface as compared to conventional carbon black, it is very hydrophobic and requires a larger amount of dispersing agent. Dispersing agent decreases conductivity by increasing interparticle resistance.

EXAMPLE 3

Hull cell chain panels were processed through the same sequence of procedures as in Example 1 except that different acid copper solutions were used for electroplating. Dispersions 1 and 2 were used for carbon coating. The number of electroplated holes are shown in Table 4.

TABLE 5

| | Number of holes electroplated | | |
|---|---|---|---|
| | Macuspec ® 9280/85 | Macuspec ® PPR | Hispec ® |
| Dispersion 1 | 7.5 | 2.5 | 9 |
| Dispersion 2 | 12.5 | 6.5 | 14 |

Example 3 shows that the use of highly conductive carbon black improves propagation through holes when electroplated with various acid copper plating solutions.

EXAMPLE 4

Hull cell chain panels were processed through the same sequence of procedures as in Example 1, except that the heat treatment step after carbon coating (step _4_) was omitted. Dispersions 1 and 2 were used for carbon coating. The number of electroplated holes are shown in Table 5. Macuspec® 9280/85 copper solution was used for electroplating. Heat treated panels were also plated as comparative examples.

TABLE 6

| | Number of holes electroplated | Copper coverage in the plated through holes |
|---|---|---|
| Dispersion 1 (heat treated) | 8 | good |
| Dispersion 1 (no heat treatment) | 6.5 | poor |
| Dispersion 2 (heat treated) | 11 | good |
| Dispersion 2 (no heat treatment) | 11.5 | good |

Example 4 shows that the heat treatment step can be eliminated when highly conductive carbon black is used in the dispersion for carbon coating due to the superior adhesion of highly conductive carbon black to the non-conductive resin/glass substrate. When conventional carbon blacks are used, the heat treatment step becomes necessary to achieve acceptable coverage and conductivity. Example 4 also demonstrates that the use of highly conductive carbon black improves propagation through holes when electroplated.

EXAMPLE 5

Double-sided boards (copper foil is laminated to opposite sides of an epoxy resin/fiberglass composite; total thickness=0.0625 inches) with various sized holes (0.02 to 0.2 inches in diameter) drilled through. The double-sided boards were prepared for electroplating by mechanically scrubbing the copper surfaces of the board, followed by desmearing.

The desmeared double sided panels are processed through the same sequence of procedures as in Example 1, except that the heat treatment step after carbon coating was omitted. Dispersions 1 and 2 were used for carbon coating. The panels were electroplated in Hispec® acid copper plating solutions for 1.5 minutes and cut through holes to examine copper coverage on the surface of the holes. Heat treated panels were also plated as comparative examples.

Electroplating after carbon black treatment begins adjacent to the copper foil in outer surfaces of the printed circuit boards and extends inward towards the center of the hole. When electroplated copper from both sides of the through hole contact in the center, it is called bridging. When double-sided panels are plated for a certain time in a same condition, a greater number of "bridged" holes indicates a superior propagation rate. The number of "bridged" holes, is shown in Table 6.

TABLE 7

| | No. of bridged holes out of 7 holes (0.120 inch holes) | No. of bridged holes out of 15 holes (0.035 inch holes) |
|---|---|---|
| Dispersion 1 (heat treated) | 5 | 12 |
| Dispersion 1 (no heat treatment) | 1 | 8 |
| Dispersion 2 (heat treated) | 7 | 15 |
| Dispersion 2 (no heat treatment) | 7 | 15 |

Example 5 shows that the heat treatment step can be eliminated when highly conductive carbon black is used for carbon coating. When conventional carbon black is used, the heat treatment step becomes necessary. This example also proves that the use of highly conductive carbon black improves propagation of through holes when electroplated.

What is claimed is:

1. A process for electroplating a conductive metal layer onto a the surface of a non-conductive material comprising the steps of:
   a. contacting said non-conductive surface with a liquid carbon black dispersion comprising:
      (i) first carbon black particles having an oil absorotion number of at least about 150 cm$^3$/100 g as a dibutyl phthalate (DBP) absorption number;
      (ii) second carbon black particles having an oil absorption number of less than about 150 cm$^3$/100 g as a DBP absorption number;
      (iii) one or more dispersing agents;
      (iv) an alkali metal hydroxide; and
      (v) water;
   b. separating substantially all of the water from the first carbon black particles and the second carbon black particles, such that the first carbon black particles and the second carbon black particles are deposited on the non-conductive surface in a substantially continuous layer; and thereafter
   c. electroplating a conductive metal layer over the deposited carbon black layer and said non-conductive surface.

2. The method according to claim 1, wherein the carbon black dispersion has a concentration of about 1 to about 5 weight percent of total carbon black particles which includes about 0.1 to about 2 weight percent of the carbon black particles having an oil absorption number of at least about 150 cm$^3$/100 g as a DBP absorption number.

3. The method according to claim 1, wherein said dispersing agent is selected from the group consisting of phosphate esters, alkaline sulfonates, organic sulfonates, ethoxylated alcohols and ethoxylated polymers based on maleic or stearic acid.

4. The method according to claim 1, wherein the pH of the carbon black dispersion is about 10–11.

5. A process for electroplating a conductive metal layer onto a surface of a non-conductive material comprising the steps of:
   a. contacting said non-conductive surface with a liquid carbon black dispersion comprising:
      (i) first carbon black particles selected from the group consisting of carbon black particles having a surface area of at least about 150 m²/g and carbon black particles having a volatiles content of less than 5% by weight;

(ii) second carbon black particles, wherein said second carbon black particles have a surface area of less than about 150 m²/g or a volatiles content of more less than 5% by weight;

(iii) one or more dispersing agents;

(iv) an alkali metal hydroxide; and (v) water;

b. separating substantially all of the water from the first carbon black particles and the second carbon black particles, such that the first carbon black particles and the second carbon black particles are deposited on the non-conductive surface in a substantially continuous layer, and thereafter c. electroplating a conductive metal layer over the deposited carbon black layer and said non-conductive surface.

6. A method according to claim 5, wherein the carbon black dispersion has a concentration of about 1 to 5 weight percent total carbon black particles which includes about 0.1 to 2 weight percent of the carbon black particles having a surface area of at least about 150 m²/g or carbon black particles having a volatiles content of less than 5% by weight.

7. A composition useful in electroplating a conductive metal layer onto a the surface of a non-conductive material, said composition comprising:

a. first carbon black particles selected from the group consisting of carbon black particles having an oil absorption number of at least about 150 cm³/100 g, carbon black particles having a surface area of at least about 150 m²/g, and carbon black particles having a volatiles content of less than 5% by weight;

b. second carbon black particles, where said second carbon black particles do not have an oil absorption number of at least about 150 cm³/100 g, a surface area of at least about 150 m²/g, or a volatiles content of less than 5% by weight;

c. one or more dispersing agents;

d. an alkali metal hydroxide; and e. water.

8. A composition according to claim 7 wherein the first carbon black particles are carbon black particles having an oil absorption number of at least about 150 cm³/100 g.

9. A composition according to claim 8 wherein the composition has a concentration of about 1 to 5 weight percent total carbon black particles which includes about 0.1 to 2 weight percent of the carbon black particles having an oil absorption number of at least about 150 cm³/100 g.

10. A composition according to claim 7, wherein the composition has a concentration of about 1 to 5 weight percent total carbon black particles which includes about 0.1 to 2 weight percent of the carbon black particles having a surface area of at least about 150 m²/g.

11. A composition according to claim 7 wherein the composition has a concentration of about 1 to 5 weight percent carbon black particles which includes about 0.1 to 2 weight percent of the carbon black particles having a volatiles content of less than 5% by weight.

12. A process for electroplating a conductive metal layer onto a surface of a non-conductive material comprising the steps of:

a. contacting said non-conductive surface with a liquid carbon black dispersion consisting essentially of:

(i) first carbon black particles selected from the group consisting of carbon black particles having an oil absorption number of at least about 150 cm³/100 g, carbon black particles having a surface area of at least about 150 m²/g, and carbon black particles having a volatiles content of less than 5% by weight;

(ii) second carbon black particles, where said second carbon black particles do not have an oil absorption number of at least about 150 cm³/100 g, a surface area of at least about 150 m²/g, or a volatiles content of less than 5% by weight;

(iii) one or more dispersing agents;

(iv) an alkali metal hydroxide; and (v) water;

b. separating substantially all of the water from the first carbon black particles and the second carbon black particles, such that the first carbon black particles and the second carbon black particles are deposited on the non-conductive surface in a substantially continuous layer; and thereafter c. electroplating a conductive metal layer over the deposited carbon black layer and said non-conductive surface.

13. The method according to claim 12, wherein said dispersing agent is selected from the group consisting of phosphate esters, alkaline sulfonates, organic sulfonates, ethoxylated alcohols and ethoxylated polymers based on maleic or stearic acid.

14. The method according to claim 12, wherein the pH of the carbon black dispersion is about 10–11.

15. A method according to claim 12, wherein the carbon black dispersion has a concentration of about 1 to 5 weight percent total carbon black particles which includes about 0.1 to 2 weight percent of the carbon black particles having a surface area of at least about 150 m²/g.

16. A method according to claim 12, wherein the carbon black dispersion has a concentration of about 1 to 5 weight percent total carbon black particles which includes about 0.1 to 2 weight percent of the carbon black particles having an oil absorption number of at least about 150 cm³/100 g.

17. A method according to claim 12, wherein the carbon black dispersion has a concentration of about 1 to 5 weight percent carbon black particles which includes about 0.1 to 2 weight percent of the carbon black particles having a volatiles content of less than 5% by weight.

* * * * *

UNITED STATES PATENT AND TRADEMARK OFFICE
CERTIFICATE OF CORRECTION

PATENT NO.        : 7,128,820 B2  
APPLICATION NO.   : 10/798522  
DATED             : October 31, 2006  
INVENTOR(S)       : Hyunjung Lee Page 1 of 1

It is certified that error appears in the above-identified patent and that said Letters Patent is hereby corrected as shown below:

Column 7

Line 43, delete the heading "TABLE 2" and replace it with --TABLE 1--

Column 8

Line 14, delete the heading "TABLE 3" and replace it with --TABLE 2--
Line 37, delete the heading "TABLE 4" and replace it with --TABLE 3--

Column 9

Line 2, delete the heading "TABLE 5" and replace it with --TABLE 4--
Line 25, delete the heading "TABLE 6" and replace it with --TABLE 5--

Column 10

Line 5, delete the heading "TABLE 7" and replace it with --TABLE 6--
Line 25, delete "the" between "onto a" and "surface of"
Line 29, delete "absorotion" and replace it with --absorption--

Column 11

Line 16, delete "layer," and replace it with --layer;--
Line 28, delete "the" between "onto a" and "surface of"

Signed and Sealed this

Thirtieth Day of January, 2007

JON W. DUDAS  
*Director of the United States Patent and Trademark Office*